(12) United States Patent
Smith

(10) Patent No.: US 8,520,347 B2
(45) Date of Patent: Aug. 27, 2013

(54) CIRCUIT FOR ESD PROTECTION INCLUDING DYNAMICALLY TERMINATED DIODE STRINGS COMPRISED OF BIPOLAR DEVICES

(75) Inventor: Jeremy Charles Smith, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 12 days.

(21) Appl. No.: 13/194,757

(22) Filed: Jul. 29, 2011

(65) Prior Publication Data

US 2013/0027834 A1  Jan. 31, 2013

(51) Int. Cl.
*H05F 3/00* (2006.01)

(52) U.S. Cl.
USPC .......................................................... 361/56

(58) Field of Classification Search
USPC .......................................................... 361/56
See application file for complete search history.

(56) References Cited

U.S. PATENT DOCUMENTS

| | | | |
|---|---|---|---|
| 5,530,612 A | 6/1996 | Maloney | |
| 5,719,737 A | 2/1998 | Maloney | |
| 5,808,342 A | 9/1998 | Chen et al. | |
| 5,811,857 A | 9/1998 | Assaderaghi et al. | |
| 5,872,378 A * | 2/1999 | Rose et al. | 257/355 |
| 5,877,927 A * | 3/1999 | Parat et al. | 361/56 |
| 5,917,336 A | 6/1999 | Smith et al. | |
| 5,959,820 A | 9/1999 | Ker et al. | |
| 6,002,568 A | 12/1999 | Ker et al. | |
| 6,034,397 A | 3/2000 | Voldman | |
| 6,157,530 A | 12/2000 | Pequignot et al. | |
| 6,215,637 B1 | 4/2001 | Teggatz et al. | |
| 6,275,089 B1 | 8/2001 | Song et al. | |
| 6,292,343 B1 | 9/2001 | Pequignot et al. | |
| 6,645,820 B1 | 11/2003 | Peng et al. | |
| 6,671,153 B1 | 12/2003 | Ker et al. | |
| 6,898,062 B2 * | 5/2005 | Russ et al. | 361/56 |
| 7,027,276 B2 | 4/2006 | Chen | |
| 7,154,724 B2 | 12/2006 | Wu et al. | |
| 7,196,890 B2 | 3/2007 | Smith | |
| 7,291,888 B2 | 11/2007 | Huang | |

(Continued)

OTHER PUBLICATIONS

Ming-Dou Ker, Tung-Yang Chen, and Chyh-Yih Chang; "ESD Protection Design for CMOS RF Integrated Circuits"; ESD Association, 2001, pp. 1-9; ESD Association, 7900 Turin Rd, Bldg 3, Rome, New York 13440-2069.

(Continued)

*Primary Examiner* — Jared Fureman
*Assistant Examiner* — Kevin J Comber
(74) *Attorney, Agent, or Firm* — Cesari & Reed LLP; R. Michael Reed

(57) ABSTRACT

An integrated circuit includes a plurality of terminals, an unterminated diode string formed from a plurality of P-N junction devices arranged in series and coupled to the plurality of terminals, and a plurality of switches. Each of the plurality of switches includes a first terminal coupled to an anode of one of the plurality of P-N junction devices and a second terminal coupled to a power supply terminal, and is controllable to selectively couple the anode to the power supply terminal in response to an ESD event. The plurality of switches configured to dissipate an ESD current associated with the ESD event and dynamically terminate the unterminated diode string at a node where the ESD current falls below a turn-on threshold of a next P-N junction device in the unterminated diode string.

20 Claims, 6 Drawing Sheets

(56) References Cited

U.S. PATENT DOCUMENTS

| | | | |
|---|---|---|---|
| 7,292,421 | B2 | 11/2007 | Smith |
| 7,313,050 | B2 * | 12/2007 | Lee et al. .................. 365/230.06 |
| 7,385,383 | B2 | 6/2008 | Reddy et al. |
| 7,408,752 | B2 | 8/2008 | Ma et al. |
| 7,622,775 | B2 | 11/2009 | Li et al. |
| 7,649,229 | B2 | 1/2010 | Kato |
| 7,773,355 | B2 | 8/2010 | Ma et al. |
| 7,813,092 | B2 | 10/2010 | Ma et al. |
| 7,859,803 | B2 | 12/2010 | Ma et al. |
| 7,859,807 | B2 | 12/2010 | Wang et al. |
| 2006/0050451 | A1 | 3/2006 | Jen-Chou |
| 2007/0236847 | A1 | 10/2007 | Jiang et al. |
| 2008/0094767 | A1 * | 4/2008 | Watanabe ....................... 361/56 |
| 2008/0232010 | A1 * | 9/2008 | Wang et al. ..................... 361/56 |
| 2009/0268357 | A1 | 10/2009 | Reynders et al. |
| 2010/0103570 | A1 | 4/2010 | Song et al. |

OTHER PUBLICATIONS

Ming-Dou Ker, Tung-Yang Chen, Tai-Ho Wang, and Chung-Yu Wu; "On-Chip ESD Protection Design by Using Polysilicon Diodes in CMOS Process"; IEEE Journal of Solid-State Circuits, vol. 36, No. 4, pp. 676-686, Apr. 2001.

Steven H. Voldman; "The State of the Art of Electrostatic Discharge Protection; Physics, Technology, Circuits, Design, Simulation, and Scaling"; IEEE Journal of Solid-State Circuits, vol. 34, No. 9, pp. 1272-1282, Sep. 1999.

Ming-Dou Ker, Hun-Hsien Chang, and Chung-Yu Wu; "A Gate-Coupled PTLSCR/NTLSCR ESD Protection Circuit for Deep-Submicron Low-Voltage CMOS IC's"; IEEE Journal of Solid-State Circuits, vol. 32, No. 1, pp. 38-51, Jan. 1997.

Ming-Dou Ker, Chyh-Yih Chang, and Yi-Shu Chang; "ESD Protection Design to Overcome Internal Damage on Interface Circuits of a CMOS IC With Multiple Separated Power Pins"; IEEE Transactions on Components and Packaging Technologies, vol. 27, No. 3, pp. 445-451, Sep. 2004.

Julian Zhiliang Chen, Ajith Amerasekera, and Charvaka Duvvery, "Design Methodology for Optimizing Gate Driven ESD Circuits in Submicron CMOS Processes," Proceedings of the Electrical Overstress/Electrostatic Discharge Symposium, Sep. 25, 1997, pp. 230-239.

* cited by examiner

CIRCUIT FOR ESD PROTECTION INCLUDING DYNAMICALLY TERMINATED DIODE STRINGS COMPRISED OF BIPOLAR DEVICES

FIELD

The present disclosure is generally related to electrostatic discharge circuits, and more particularly to electrostatic discharge (ESD) protection circuits using diode strings.

BACKGROUND

Electrostatic discharge (ESD) refers to the phenomenon whereby an electrical current of high amplitude and short duration is discharged at the package nodes of an integrated circuit due to static charge build-up on the integrated circuit (IC) package or on a nearby object, such as a human being or an IC handling machine. Without ESD protection circuitry, an ESD event can damage the IC. Accordingly, circuit designers have developed ESD protection circuitry to discharge ESD currents in a short time in a nondestructive manner.

A diode string represents one type of ESD circuit that can be used to discharge ESD currents. The diode string is formed in bulk material of a semiconductor substrate by series-connecting P-N junctions typically formed in n-well regions. In particular, each n-well formed in the P-type bulk material is tapped via an n+ diffusion and is connected to the p+ terminal of the next diode. The combination of a P+ diffusion contained in an n-well over a P-type substrate forms a parasitic PNP transistor by default, such that the "diode string" is really a chain of PNP transistors. However, to dissipate a power event using such diode strings, the diode string is connected to each exposed terminal, and the size of the diode string is selected to dissipate worst-case ESD event, which results in the inclusion of multiple circuit components that are only used occasionally, if ever.

SUMMARY

In an integrated circuit includes a plurality of terminals, an unterminated diode string formed from a plurality of P-N junction devices arranged in series and coupled to the plurality of terminals, and a plurality of switches. Each of the plurality of switches includes a first terminal coupled to an anode of one of the plurality of P-N junction devices and a second terminal coupled to a power supply terminal, and is controllable to selectively couple the anode to the power supply terminal in response to an ESD event. The plurality of switches configured to dissipate an ESD current associated with the ESD event and dynamically terminate the unterminated diode string at a node where the ESD current falls below a turn on threshold of a next P-N junction device in the unterminated diode string.

In another embodiment, a circuit includes a conductive terminal and an unterminated diode string formed from a plurality of P-N junction devices and coupled to the conductive terminal. Each of the plurality of P-N junction devices includes a first electrode and a second electrode. The circuit further includes a plurality of switches. Each of the plurality of switches includes a first terminal coupled to the first electrode of one of the plurality of P-N junction devices and includes a second terminal coupled to a power supply terminal. Each of the plurality of switches is controllable to selectively provide a current flow path from the first electrode of the one of the plurality of P-N junction devices to the power supply terminal in response to an ESD event.

In still another embodiment, a circuit for electrostatic discharge (ESD) protection includes a plurality of conductive terminals and an unterminated diode string formed from a first plurality of P-N junction devices. Each of the first plurality of P-N junction devices has a first current electrode coupled to a control electrode of a previous P-N junction device in the unterminated diode string, a second current electrode coupled to a power supply terminal, and a control electrode coupled to a first current electrode of a next bipolar junction transistor in the unterminated diode string. The circuit further includes a second plurality of P-N junction devices. Each of the second plurality of P-N junction devices has a first current electrode coupled to one of the plurality of conductive terminals, a second current electrode coupled to the power supply terminal, and a base coupled to a first current electrode of one of the first plurality of P-N junction devices. The circuit also includes a plurality of switches. Each of the plurality of switches includes a first current electrode coupled to the first current electrode of one of the first plurality of P-N junction devices, a second current electrode coupled to the power supply terminal, and a control terminal. Each of the plurality of switches is responsive to an ESD event to conduct an ESD current from the first current electrode of the one of the first plurality of P-N junction devices to the power supply terminal.

DETAILED DESCRIPTION OF ILLUSTRATIVE EMBODIMENTS

Figure 1:
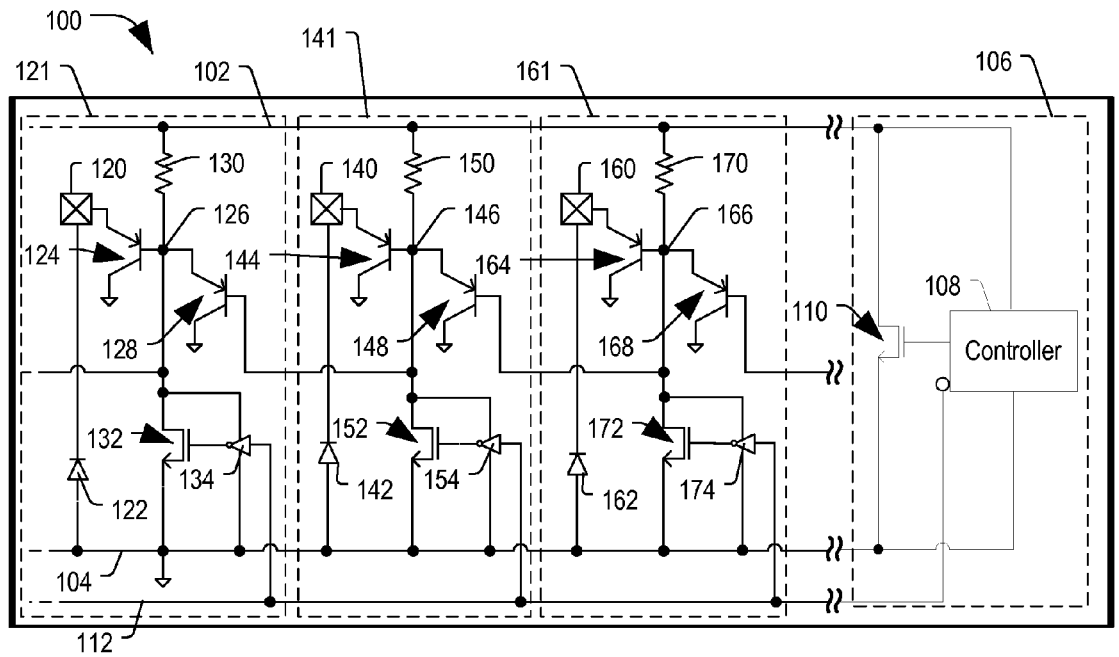
FIG. 1 is a partial block diagram and partial circuit diagram of a group of I/O pad circuits including ESD protection circuitry for dissipating ESD events.

In the following discussion, the same reference numerals are reused within the figures to indicate the same or similar elements.

An ESD protection circuit includes a dynamically terminating diode string having multiple switches (implemented as metal oxide semiconductor field effect transistors (MOSFETs)), which can be activated to dissipate ESD current to ground. Such switches are turned off during normal operation, and are turned on during an ESD event to dissipate current. As the current is diverted away from the diode string, the associated voltages are reduced through multiple stages of the diode string until the voltage level falls below a forward bias voltage of a next diode in the string. Thus, the switches operate to dissipate current, dynamically altering the effective length of the diode string for each ESD event. An example of a circuit for ESD protection including a dynamically terminated diode string comprised of bipolar junction devices is described below with respect to FIG. 1.

FIG. 1 is a partial block diagram and partial circuit diagram of a circuit 100 including ESD protection circuitry for dissipating ESD events. Circuit 100 includes a power supply terminal 102 and a power supply terminal 104, which supply power to circuit 100. Circuit 100 optionally includes power supply protection circuit 106, including a controller 108 including a first terminal connected to power supply terminal 102 and a second terminal connected to power supply terminal 104. Controller 108 further includes a control output connected to a gate of MOSFET 110, which has a drain connected to power supply terminal 102 and a source connected to power supply terminal 104. Controller 108 further includes an inverted control output connected to control line 112.

Circuit 100 further includes a plurality of terminals, such as terminals 120, 140, and 160, which can connected to external circuits. In some instances, terminals 120, 140, and 160 may be pads, contact locations, pins, or other conductive elements that receive a transient discharge from an ESD event. Terminal 120 is connected to a cathode terminal of a diode 122, which has an anode terminal connected to power supply terminal 104. Terminal 120 is also connected to an emitter of a PNP bipolar junction transistor (BJT) 124, which has a base connected to a node 126 and to a first terminal of a resistor 130, and has a collector connected to ground. Resistor 130 includes a second terminal connected to power supply terminal 102. A MOSFET 132 includes a drain connected to node 126, a source connected to power supply terminal 104, and a gate connected to an output of an inverter 134. Inverter 134 has a first supply input connected to node 126, a second supply input connected to power supply terminal 104, and an input connected to control line 112. A BJT 128 includes an emitter connected to node 126, a collector connected to ground, and a base connected to a node 146.

Terminal 140 is connected to a cathode terminal of a diode 142, which has an anode terminal connected to power supply terminal 104. Terminal 140 is also connected to an emitter of BJT 144, which has a base connected to node 146 and to a first terminal of a resistor 150, and has a collector connected to ground. Resistor 150 includes a second terminal connected to power supply terminal 102. A MOSFET 152 includes a drain connected to node 146, a source connected to power supply terminal 104, and a gate connected to an output of an inverter 154. Inverter 154 has a first supply input connected to node 146, a second supply input connected to power supply terminal 104, and an input connected to control line 112. A BJT 148 includes an emitter connected to node 146, a collector connected to ground, and a base connected to a node 166.

Terminal 160 is connected to a cathode terminal of a diode 162, which has an anode terminal connected to power supply terminal 104. Terminal 160 is also connected to an emitter of BJT 164, which has a base connected to node 166 and to a first terminal of a resistor 170, and has a collector connected to ground. Resistor 170 includes a second terminal connected to power supply terminal 102. A MOSFET 172 includes a drain connected to node 166, a source connected to power supply terminal 104, and a gate connected to an output of an inverter 174. Inverter 174 has a first supply input connected to node 166, a second supply input connected to power supply terminal 104, and an input connected to control line 112. A BJT 168 includes an emitter connected to node 166, a collector connected to ground, and a base connected to a next node in the diode string.

In the illustrated example, dashed lines 121, 141, and 161 depict the physical boundaries of the input/output (I/O) cells. The unterminated diode string provides a common ESD protection circuit that is accessible to each of the I/O cells in response to an ESD event.

Resistors 130, 150, and 170 operate as triggering circuits between the power supply terminal 102 and the bases of BJTs 124, 144, and 164. In an alternative embodiment, different triggering circuits or impedances can be used. One advantage of the configuration of circuit 100 is that the triggering impedance (of resistors 130, 150 and 170) is totally separated from the ESD termination impedance, making it possible to vary the triggering resistance without affecting the ESD protection circuitry.

In an example, during normal operation, MOSFETs 132, 152, and 172 operate as open circuits to prevent current flow to power supply terminal 104 from nodes 126, 146, and 166, respectively. In a positive ESD event, controller 108 detects a voltage potential between first and second supply terminals 102 and 104 that exceeds a threshold voltage level and activates MOSFET 110 to operate as a rail clamp and to shunt excess current from power supply terminal 102 to power supply terminal 104. Further, controller 108 applies a control signal to control line 112, which control signal is inverted by inverters 134, 154, and 174 to activate MOSFETs 132, 152, and 172 to conduct current to power supply terminal 104 from nodes 126, 146, and 166, respectively. Circuit 100 may include any number of MOSFETs 132, 152, and 172 and corresponding P-N junction devices, such as BJTs 124, 128, 144, 148, 164 and 168.

In response to an ESD event, only some of the P-N junction devices are recruited for dissipating the transient voltage/current. In particular, controller 108 biases each of the MOSFETs 132, 152, and 172 to conduct current from nodes 126, 146, and 166, respectively, to power supply terminal 104. Each MOSFET 132, 152, and 172 diverts a portion of the current until the remaining voltage falls below a forward bias voltage of the next P-N junction in the diode string. For example, an ESD event at terminal 120 is dissipated through the emitter-base (P-N) junction of BJT 124 to node 126, and MOSFET 132 allows some of the current to flow through its conducting channel from the drain to the source and to power supply terminal 104, dissipating a portion of the current from the ESD event. Further, the remaining charge at node 126 forward biases the P-N junction of BJT 128, delivering the remaining charge from the ESD event (minus the diode drop dissipated by the P-N junction of BJT 128) to node 146. MOSFET 152 dissipates a portion of the current through its conducting channel from the drain to the source and to power supply terminal 104, dissipating a portion of the current from the ESD event. The remaining charge may forward bias the P-N junction of BJT 148, and so on. At each stage (i.e., at each P-N junction) of the diode string, the diode string can be dynamically terminated if there is insufficient charge remaining from the ESD event to forward bias the next P-N junction. Thus, BJTs 128, 148, and 168 (and other BJTs not shown) cooperate with MOSFETs 132, 152, and 172 (and other MOSFETs not shown) to dissipate current from an ESD event, dynamically terminating the diode string at the node where the current is dissipated to a level that is insufficient to recruit a next stage of the diode string.

In the illustrated example of FIG. 1, circuit 100 includes ESD protection circuitry that includes a diode string formed from a plurality of P-N junction devices (i.e., BJTs 128, 148, and 168) arranged in series to form a plurality of stages (i.e., a plurality of diode stages or emitter-base (P-N) junction stages) and a plurality of switches formed from MOSFETs 132, 152, and 172. In the illustrated example, each stage is connected by a P-N junction device (e.g., BJT 124, 144, and 164) to a conductive terminal, such as terminals 120, 140, and 160, respectively. However, in other implementations, some P-N junction devices may participate solely in the diode string with no connection to a terminal. Each of the plurality of switches including a first terminal connected to one of the plurality of stages of the diode string (e.g., MOSFET 132 includes a drain connected to an emitter of BJT 128 at node 126, and MOSFET 152 includes a drain connected to an emitter of BJT 148 at node 146), a second terminal connected to a power supply terminal (e.g., each of the MOSFETs 132 and 152 include a source connected to power supply terminal 104). Each of the MOSFETs 132 and 152 is controllable to selectively couple one of the plurality of stages to the power supply terminal 104 in response to an ESD event.

In an example, each of the I/O terminals, such as terminals 120, 140, and 160, can be connected together with an "endless" diode string (i.e., an unterminated diode string) formed by the P-N junctions of the emitter-bases of BJTs 128, 148, and 168. In an example, the diode string may be connected in a ring so that the diode string is continuous. During an ESD event, the MOSFETs 132, 152, and 172 operate to dynamically terminate the diode string. If terminal 120, 140 or 160 is struck with an ESD pulse, ESD current flows between the terminals 120, 140, and 160 in one direction, and the ESD current is dissipated locally in a few "on" cells. The ESD protection circuitry dynamically picks the number of stages needed to dissipate a particular ESD event based on the source resistance and the gain factor (β).

In active mode, the emitter-base voltage ($V_{EB}$) between the emitter and the base of BJT 128, for example, causes the p+ type emitter to be higher in electrical potential than the n+ type base, forward biasing the base-emitter (P-N) junction. The base current ($I_B$) is proportional to the emitter current ($I_E$) flowing from the emitter into the p+ diffused area as a function of one over the vertical current gain (β) plus 1 as shown in Equation 1 below.

$$I_B = \frac{1}{\beta + 1} I_E \quad (1)$$

Further, the collector current ($I_C$) is proportional to the emitter current ($I_E$) as a function of the vertical current gain divided by the vertical current gain (β) plus one according to Equation 2 below:

$$I_C = \frac{\beta}{\beta + 1} I_E \quad (2)$$

In a diode stack or diode string, several BJT devices, such as BJT 128, are connected such that the n+ diffusion area of the base is connected to the p+ diffusion area of the emitter of a next BJT device in the diode string. In a particular example, an n-well is tapped and fed to a p+ diffusion area of a next BJT in the string. Any number of P-N junctions can be strung together in this way. Further, the n-wells also form a rectifying junction with the substrate such that the "diode string" represents a chain of PNP connected transistors.

Figure 2:
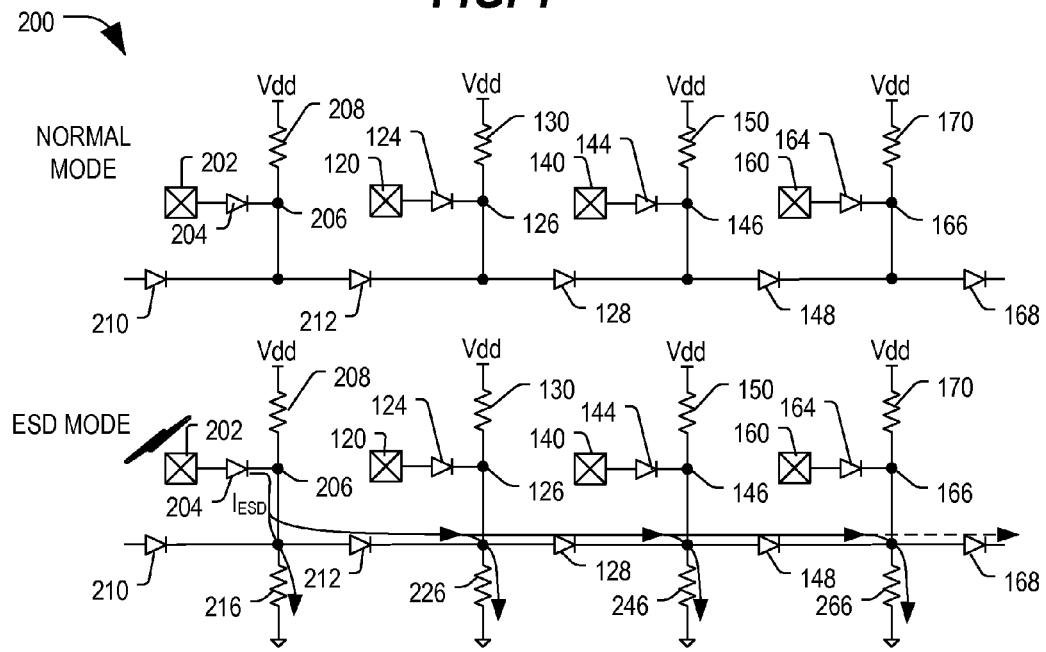
FIG. 2 is a conceptual circuit diagram of the circuit of FIG. 1 depicting current flow paths during normal mode and during an ESD mode.

FIG. 2 is a conceptual circuit diagram 200 of the circuit 100 of FIG. 1 depicting current flow paths during normal mode and during an ESD mode. Diagram 200 includes the diode stages described with respect to FIG. 1 and includes an additional diode stage connected to terminal 202, including a diode 204 having an anode connected to terminal 202 and a cathode connected to a node 206. A resistor 208 includes a first terminal connected to node 206 and a second terminal connected to power supply terminal (Vdd) 102. Node 206 is connected to a cathode terminal of diode 210 in the diode string and to an anode terminal of a diode 212, which has a cathode terminal connected to an anode terminal of the P-N junction of BJT 128. In this example, the P-N junctions of BJTs 204, 210, 212, 124, 128, 244, 148, 164, and 168 are depicted as diodes.

During normal operation, the diode string represented by diodes 210, 212, 128, 148, and 168 is present; however, the MOSFETs 132, 152, and 172 in FIG. 1 are turned off. Accordingly, there is no resistive current path to ground from the anode terminals of the diode string.

During an ESD event, ESD current flows into the diode string, including diodes 212, 128, and 148, and to ground across resistors (shunt elements) 216, 226, 246, and 266, respectively. In this instance, resistors 226, 246, and 266 represent the channel resistances of the MOSFETs 132, 152, and 172 in FIG. 1. In this example, an ESD event on terminal 202 dissipates locally within a few "on" cells, such as resistor 216, diode 212, resistor 226, diode 128, and resistor 246. Depending on the magnitude of the ESD event, additional diodes and source resistances may be recruited as needed to fully discharge the ESD current.

While the above-discussion focused on the circuit, the ease with which the above-described circuit dissipates ESD currents can be readily observed with respect to the diagrams presented in FIGS. 3-7 below. In particular, for illustrative purposes, a system implementing the circuit 100 having ten terminals diode coupled to an endless diode string and without a rail clamp circuit (e.g., with the control line 112 coupled to ground) was tested using a 2 kV ESD discharge. An example of the results of testing for the aforementioned circuit having an alpha of 0.3 and a triggering resistance of 0.1 Ohms is described below with respect to FIG. 3.

Figure 3:
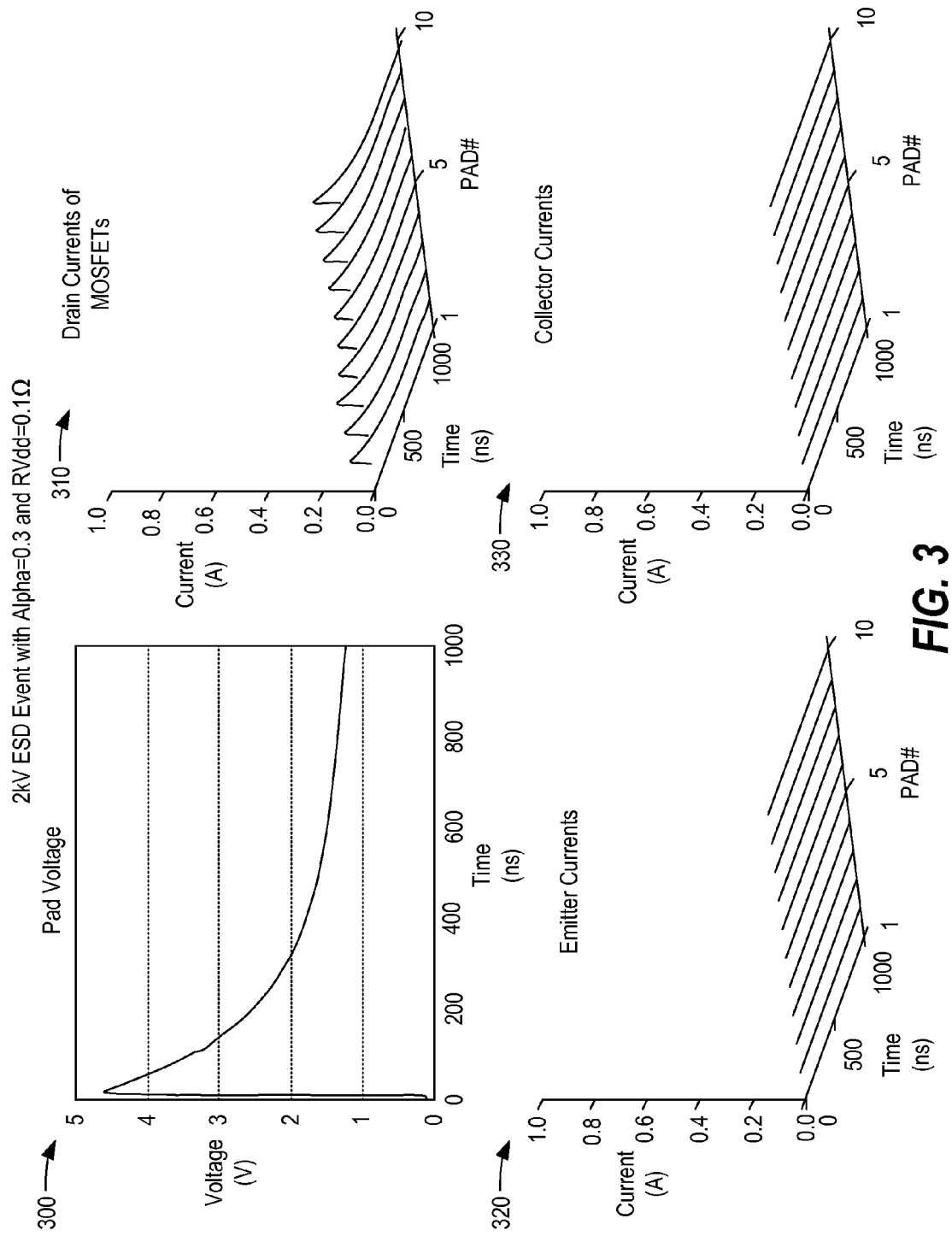
FIG. 3 depicts simulated outputs for a ten input/output (I/O) pad system where a first graph of pad voltage versus time, a second graph of drain currents versus pad number, a third graph of emitter currents versus pad number, and a fourth graph of collector current versus pad number for a first embodiment of the circuit of FIG. 1.

FIG. 3 depicts a first graph 300 of pad voltage versus time, a second graph 310 of drain currents versus pad number, a third graph 320 of emitter currents versus pad number, and a fourth graph 330 of collector current versus pad number for a first embodiment of the circuit 100 of FIG. 1. The first embodiment of the circuit 100 has ten input/output (I/O) terminals and an "endless" diode string diode coupled to each of the I/O terminals. Further, BJTs 124, 128, 144, 148, 164, and 168 are designed to a common-base current gain (αF which is approximately the gain of current from emitter to collector in the forward-active region) that is approximately equal to 0.3, a bus resistance of approximately 0.1 Ohms, and a triggering resistance of approximately 0.1 Ohms.

In response to a 2 kV ESD event, the first graph 300 illustrates that the pad voltage rises from a level near zero volts to about 4.7 volts and then decays exponentially to a level of approximately 1.2 volts within 1000 nanoseconds. As illustrated in graph 310, the drain currents of the MOSFETs behave pretty much uniformly across the pads, briefly increasing to a level of about 0.1 amperes before decaying to approximately zero amperes before approximately 500 nanoseconds have elapsed. However, as shown in graphs 320 and 330, the 2 kV ESD event resulted in no bipolar junction device conduction, since the emitter currents in graph 320 and the collector currents in graph 330 remain at unchanged (approximately zero amperes) throughout the ESD event.

Figure 4:
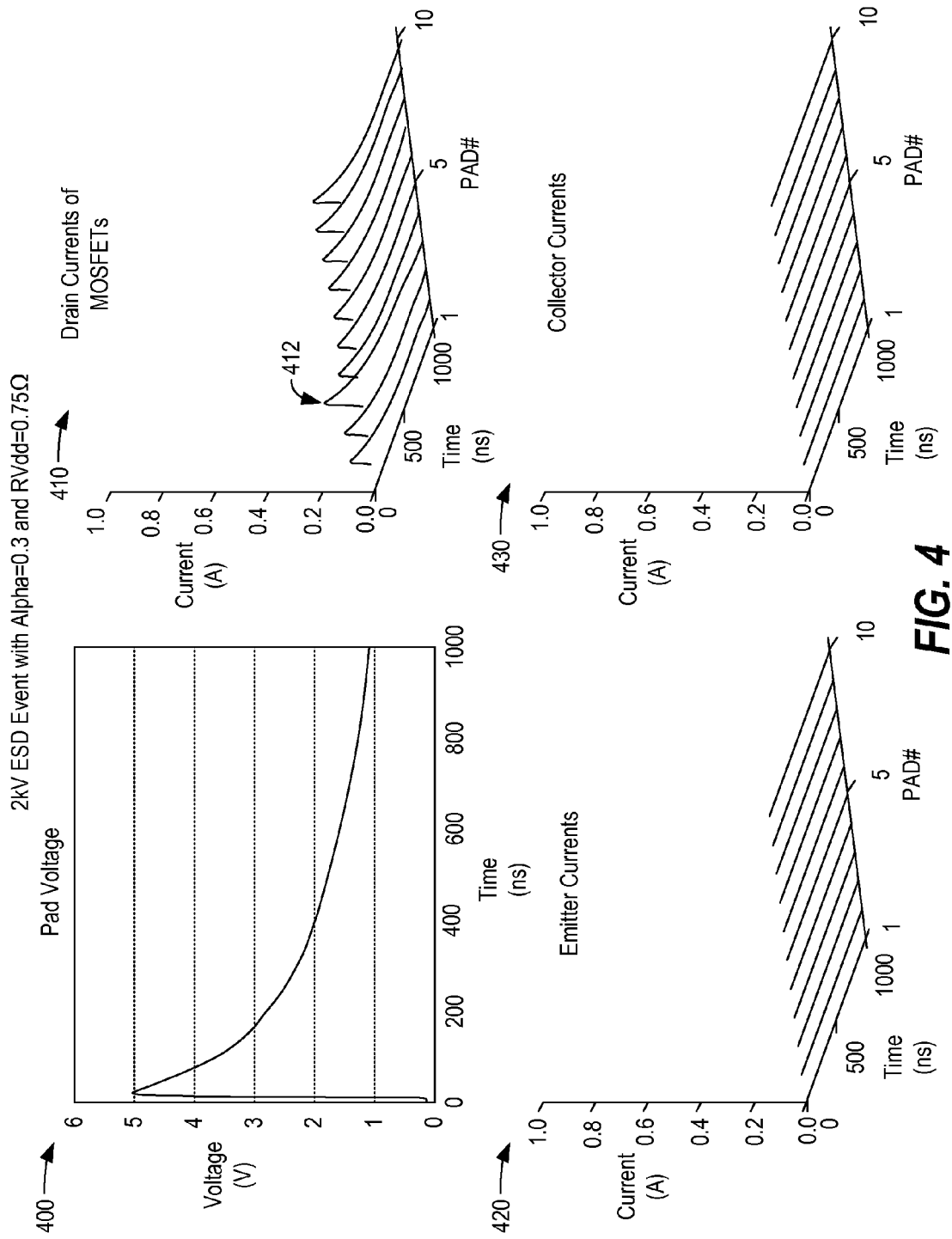
FIG. 4 depicts simulation output for a ten I/O pad system where a first graph of pad voltage versus time, a second graph of drain currents versus pad number, a third graph of emitter currents versus pad number, and a fourth graph of collector current versus pad number for a second embodiment of the circuit of FIG. 1.

FIG. 4 depicts a first graph 400 of pad voltage versus time, a second graph 410 of drain currents versus pad number, a third graph 420 of emitter currents versus pad number, and a fourth graph 430 of collector current versus pad number for a second embodiment of the circuit 100 of FIG. 1. In this second embodiment, circuit 100 has the same alpha and bus resistance as the first embodiment, but has a triggering resistance of approximately 0.75 Ohms.

In response to the 2 kV ESD event on pad number three, the first graph 400 illustrates that the pad voltage rises from a level near zero volts to approximately 5.1 volts (slightly higher than the first embodiment described with respect to FIG. 3) and then decays exponentially to a level of approximately 1.2 volts within 1000 nanoseconds (which is approximately the same as the first embodiment). As illustrated in graph 410, the drain current of the MOSFET associated with the node that is diode connected to pad number three initially rises to a level of approximately 0.2 amperes as indicated at 412, which is double that of the other MOSFETs, before decaying exponentially as before. While this MOSFET works a little harder than the rest of the MOSFETs, the other MOSFETs operate almost uniformly, rising to approximately 0.1 amperes before decaying. Once again, as shown in graphs 420 and 430, the 2 kV ESD event resulted in no bipolar junction device conduction, since the emitter currents in graph 420 and the collector currents in graph 430 remain at unchanged (approximately zero amperes) throughout the ESD event.

Figure 5:
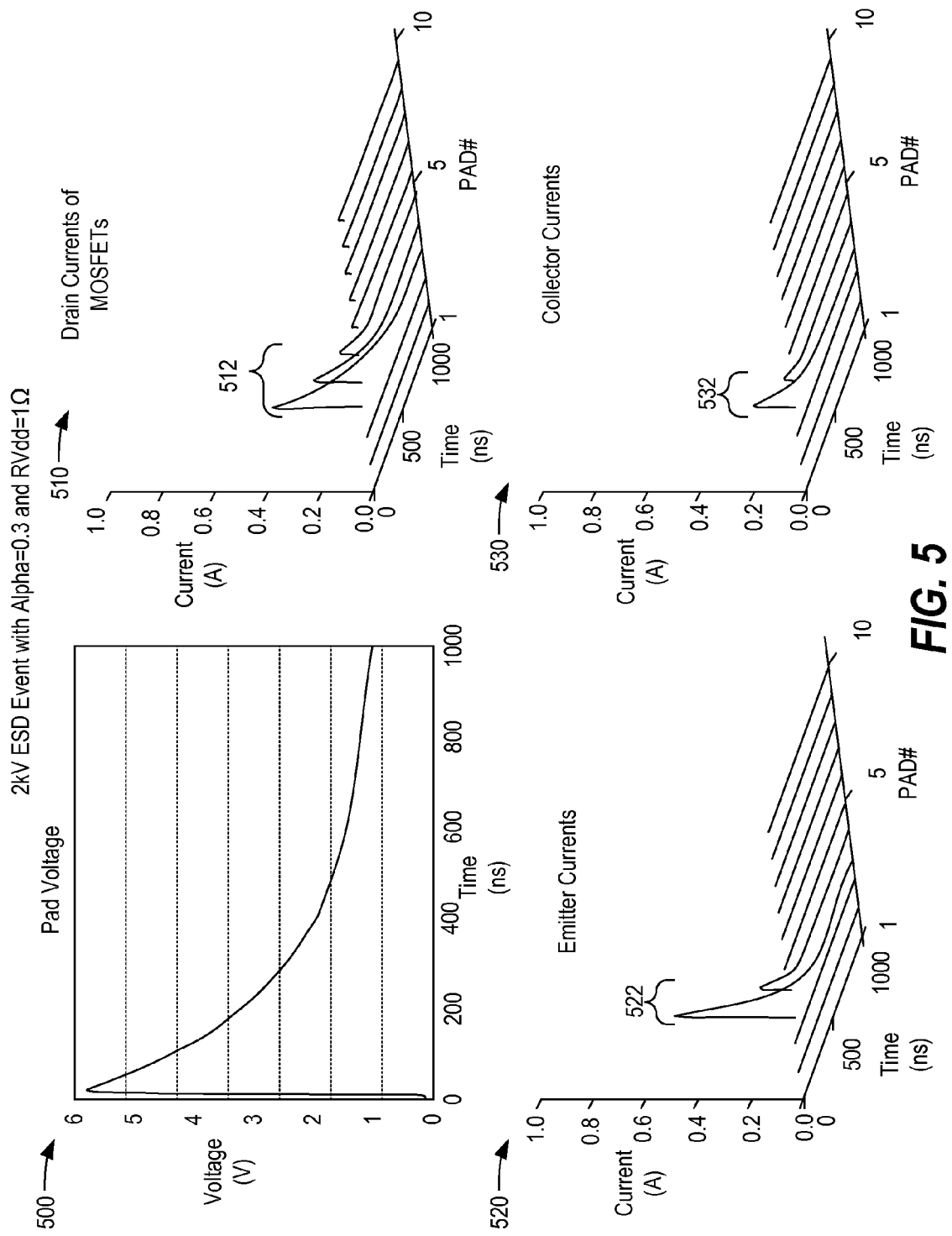
FIG. 5 depicts simulation output for a ten I/O pad system where a first graph of pad voltage versus time, a second graph of drain currents versus pad number, a third graph of emitter currents versus pad number, and a fourth graph of collector current versus pad number for a third embodiment of the circuit of FIG. 1.

FIG. 5 depicts a first graph 500 of pad voltage versus time, a second graph 510 of drain currents versus pad number, a third graph 520 of emitter currents versus pad number, and a fourth graph 530 of collector current versus pad number for a third embodiment of the circuit 100 of FIG. 1. The third embodiment of circuit 100 has the same alpha and bus resistance, but the triggering resistance is increased to approximately 1 Ohm.

In response to the 2 kV ESD event on pad number three, the first graph 500 illustrates that the pad voltage rises from a level near zero volts to approximately 5.8 volts and then decays exponentially to a level of approximately 1.2 volts within 1000 nanoseconds (which is approximately the same as the first embodiment). As illustrated in graph 510, the drain currents of the MOSFET associated with the node that is diode connected to pad number three and two other MOSFETS coupled to subsequent nodes of the diode string increase initially and then decay rapidly (as generally indicated at 512). The drain current of the MOSFET associated with pad number three initially rises to a level of approximately 0.4 amperes. The drain current of the next MOSFET rises to approximately 0.2 amperes, and the next MOSFET rises to approximately 0.1 amperes before decaying. The other MOSFETs do not conduct current.

Graph 520 depicts an initial increase in the emitter currents of the P-N junction devices of the diode string portion that is diode connected to pad number three and the adjacent P-N junction device (as generally indicated at 522). The emitter current of the P-N junction device associated with pad number three initially increases to approximately 0.5 amperes and then quickly decays. The emitter current of the P-N junction device associated with pad number four initially increases to approximately 0.2 amperes. The remaining P-N junction devices do not appear to conduct emitter currents. Thus, only two P-N junction devices become forward biased in response to the ESD event.

Graph 530 confirms that the P-N junction device associated with pad number three and the adjacent P-N junction device are activated by the ESD event, as indicated by the initial increases in their collector currents (as generally indicated at 532), which quickly decay. The collector current of the P-N junction device associated with pad number three initially increases to approximately 0.2 amperes, and the collector current of the P-N junction device associated with pad number four initially increases to approximately 0.04 amperes. The other P-N junction devices remain off.

Figure 6:
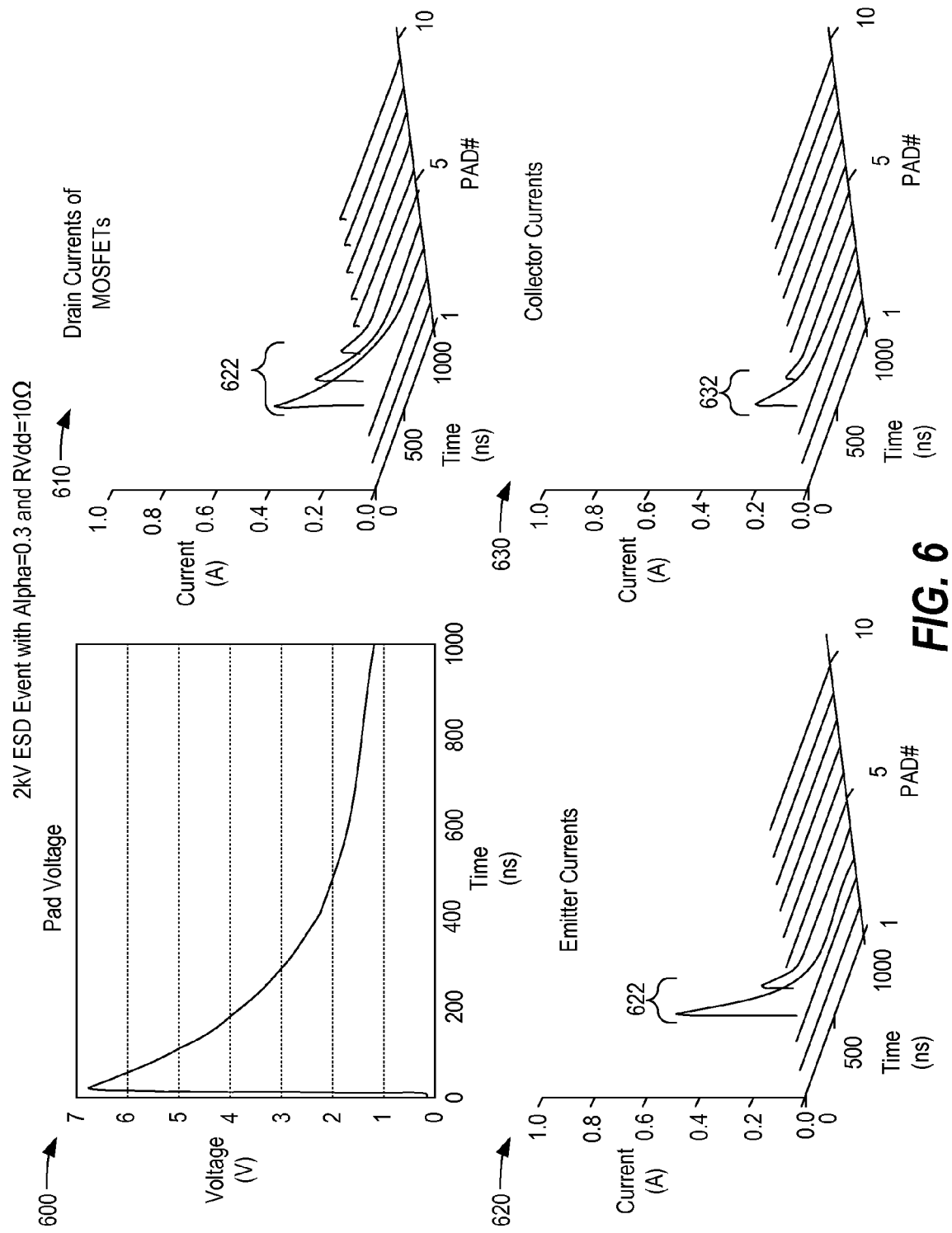
FIG. 6 depicts simulation output for a ten I/O pad system where a first graph of pad voltage versus time, a second graph of drain currents versus pad number, a third graph of emitter currents versus pad number, and a fourth graph of collector current versus pad number for a fourth embodiment of the circuit of FIG. 1.

FIG. 6 depicts a first graph 600 of pad voltage versus time, a second graph 610 of drain currents versus pad number, a third graph 620 of emitter currents versus pad number, and a fourth graph 630 of collector current versus pad number for a fourth embodiment of the circuit 100 of FIG. 1. The fourth embodiment of circuit 100 has the same alpha and bus resistance, but the triggering resistance is increased to approximately 10 Ohms.

In response to the 2 kV ESD event on pad number three, the first graph 600 illustrates that the pad voltage rises from a level near zero volts to approximately 6.8 volts and then decays exponentially to a level of approximately 1.2 volts within 1000 nanoseconds (which is approximately the same as the first embodiment). As illustrated in graph 610, the drain currents of the MOSFET associated with the node that is diode connected to pad number three and the two other MOSFETS coupled to subsequent nodes of the diode string increase initially and then decay rapidly (as generally indicated at 612). The drain current of the MOSFET associated with pad number three initially rises to a level of approximately 0.4 amperes. The drain current of the next MOSFET rises to approximately 0.2 amperes, and the next MOSFET rises to approximately 0.1 amperes before decaying. The other MOSFETs do not conduct current.

Graph 620 depicts an initial increase in the emitter current of the P-N junction devices of the diode string portion that is diode connected to pad number three and the adjacent P-N junction device (as generally indicated at 622). The emitter current of the P-N junction device associated with pad number three initially increases to approximately 0.5 amperes and then quickly decays. The emitter current of the P-N junction device associated with pad number four initially increases to approximately 0.2 amperes. The remaining P-N junction devices do not appear to conduct emitter currents. Thus, only two P-N junction devices become forward biased in response to the ESD event.

Graph 630 confirms that the P-N junction device associated with pad number three and the adjacent P-N junction device have initial increases in their collector currents (as generally indicated at 632), which quickly decay. The collector current of the P-N junction device associated with pad number three initially increases to approximately 0.2 amperes, and the collector current of the P-N junction device associated with pad number four initially increase to approximately 0.04 amperes. The other P-N junction devices remain off.

Figure 7:
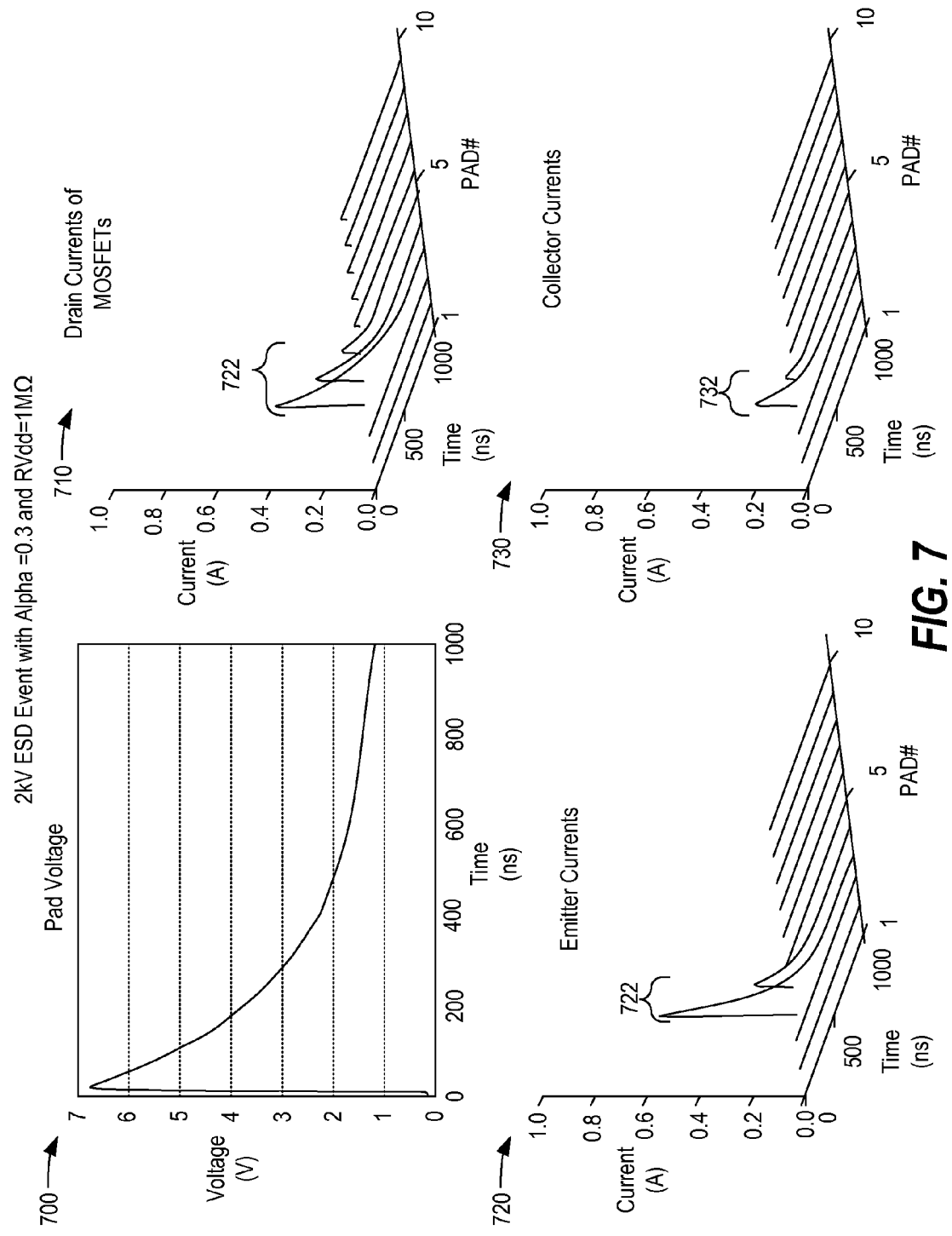
FIG. 7 depicts simulation output for a ten I/O pad system where a first graph of pad voltage versus time, a second graph of drain currents versus pad number, a third graph of emitter currents versus pad number, and a fourth graph of collector current versus pad number for a fifth embodiment of the circuit of FIG. 1.

FIG. 7 depicts a first graph 700 of pad voltage versus time, a second graph 710 of drain currents versus pad number, a third graph 720 of emitter currents versus pad number, and a fourth graph 730 of collector current versus pad number for a fifth embodiment of the circuit of FIG. 1. The fifth embodiment of circuit 100 has the same alpha and bus resistance, but the triggering resistance is increased to approximately 1 MΩ.

In response to the 2 kV ESD event on pad number three, the first graph 700 illustrates that the pad voltage rises from a level near zero volts to approximately 6.8 volts and then decays exponentially to a level of approximately 1.2 volts within 1000 nanoseconds (which is approximately the same as the first embodiment). As illustrated in graph 710, the drain currents of the MOSFET associated with the node that is diode connected to pad number three and the two other MOSFETS coupled to subsequent nodes of the diode string increase initially and then decay rapidly (as generally indicated at 712). The drain current of the MOSFET associated with pad number three initially rises to a level of approximately 0.4 amperes. The drain current of the next MOSFET rises to approximately 0.2 amperes, and the next MOSFET rises to approximately 0.1 amperes before decaying. The other MOSFETs do not conduct current.

Graph 720 depicts an initial increase in the emitter current of the P-N junction devices that of the diode string portion that is diode connected to pad number three and the adjacent P-N junction device (as generally indicated at 722). The emitter current of the P-N junction device associated with pad number three initially increases to approximately 0.5 amperes and then quickly decays. The emitter current of the P-N junction device associated with pad number four initially increases to approximately 0.2 amperes. The remaining P-N junction devices do not appear to conduct emitter currents. Thus, only two P-N junction devices become forward biased in response to the ESD event.

Graph 730 confirms that the P-N junction device associated with pad number three and the adjacent P-N junction device have initial increases in their collector currents (as generally indicated at 732), which quickly decay. The collector current of the P-N junction device associated with pad number three initially increases to approximately 0.2 amperes, and the collector current of the P-N junction device associated with pad number four initially increase to approximately 0.04 amperes. The other P-N junction devices remain off.

Thus, the triggering resistance has a small influence on the number of stages of the diode string that are used to dissipate an ESD event. Further, the magnitude of the charge of the ESD event also influences the number of diodes recruited to dissipate the current. However, the MOSFETs 132, 152, and 172 (and other MOSFETS (not shown) that are connected to nodes of the diode string) operate to dissipate current to power supply terminal 104, dynamically terminating the "endless" diode string when the ESD current is discharged to a level that is below a turn on level of a next diode within the diode string.

In conjunction with the circuits and methods disclosed above, a circuit includes an unterminated diode string (an "endless" diode string) formed from a plurality of bipolar junction transistor devices and includes a plurality of MOSFETs. Each of the plurality of bipolar junction transistor devices is diode connected to one or more conductive terminals. Each of the anodes of the unterminated diode string are connectable by a MOSFET of the plurality of MOSFETs to a power supply terminal to controllably discharge current from the anode to the power supply terminal, for example, in response to an ESD event. The MOSFETs operate to dissipate current and to dynamically terminate the diode string when the ESD current is discharged to a level that is insufficient to forward bias a next P-N junction in the string.

Although the present invention has been described with reference to preferred embodiments, workers skilled in the art will recognize that changes may be made in form and detail without departing from the scope of the invention.

What is claimed is:

1. An integrated circuit comprising:
    a plurality of terminals;
    a diode string formed from a plurality of P-N junction devices arranged in series and coupled to the plurality of terminals; and
    a plurality of switches, each of the plurality of switches including a first terminal coupled to an anode of one of the plurality of P-N junction devices and a second terminal coupled to a second power supply terminal, and controllable to selectively couple the anode to the second power supply terminal in response to an ESD event;
    wherein the plurality of switches is configured to dissipate an ESD current associated with the ESD event and dynamically terminate the diode string at a node where the ESD current falls below a turn on threshold of a next P-N junction device in the diode string.

2. The integrated circuit of claim 1, wherein each of the plurality of switches operates to sink a portion of the ESD current to the second power supply terminal.

3. The integrated circuit of claim 1, further comprising a plurality of diodes, each of the plurality of diodes including an anode terminal coupled to the second power supply terminal and a cathode terminal coupled to a respective one of the plurality of terminals.

4. The integrated circuit of claim 1, wherein each of the plurality of P-N junction devices comprises a PNP bipolar junction transistor including an emitter coupled to one of the plurality of terminals, a collector coupled to the second power supply terminal, and a base coupled to an emitter of a next PNP bipolar junction transistor in the diode string.

5. The integrated circuit of claim 4, further comprising a plurality of resistors, each resistor including a first terminal coupled to a first power supply terminal and a second terminal coupled to the emitter of one of the plurality of P-N junction devices.

6. The integrated circuit of claim 1, wherein each of the plurality of switches comprises:
    a metal oxide semiconductor field effect transistor (MOSFET) including a drain coupled to one of the plurality of P-N junction devices, a source coupled to the second power supply terminal, and a gate; and
    an inverter including an output coupled to the gate and an input coupled to a control line; and
    wherein the MOSFET is responsive to the ESD event to conduct current from the one of the plurality of P-N junction devices to the second power supply terminal.

7. The integrated circuit of claim 6, further comprising:
    a power supply protection circuit including a first terminal coupled to the first power supply terminal, a second terminal coupled to a second power supply terminal, and a control output coupled to the control line; and
    wherein the power supply protection circuit is configured to apply a control signal to the control line in response to detecting a voltage potential between the first power supply terminal and the second power supply terminal that exceeds a pre-determined threshold.

8. A circuit comprising:
    a conductive terminal;
    a diode string formed from a plurality of P-N junction devices and coupled to the conductive terminal, each of the plurality of P-N junction devices including a first current electrode and a second current electrode; and
    a plurality of switches, each of the plurality of switches including a first terminal coupled to the first current electrode of one of the plurality of P-N junction devices and including a second terminal coupled to a power supply terminal, each of the plurality of switches controllable to selectively provide a current flow path from the first electrode of the one of the plurality of P-N junction devices to the power supply terminal.

9. The circuit of claim 8, wherein the plurality of switches operate to:
   divert current conducted by each of the plurality of P-N junction devices; and
   dynamically terminate the diode string at the first current electrode of one of the plurality of P-N junction devices where an ESD current associated with the ESD event falls below a turn on threshold of the one of the plurality of P-N junction devices.

10. The circuit of claim 8, wherein each of the plurality of P-N junction devices comprises a bipolar junction transistor having the first current electrode coupled to a base of a previous bipolar junction transistor in the diode string, the second current electrode coupled to the power supply terminal, and a base coupled to an emitter of a next bipolar junction transistor in the diode string.

11. The circuit of claim 10, wherein each of the plurality of switches comprises a metal oxide semiconductor field effect transistor (MOSFET) including:
   a first current electrode coupled to the first current electrode of one of the plurality of P-N junction devices;
   a second current electrode coupled to the second power supply terminal; and
   a control electrode.

12. The circuit of claim 11, further comprising a plurality of inverters, each inverter including an output coupled to the control electrode of one of the plurality of switches, and an input coupled to a control line.

13. The circuit of claim 12, wherein:
   each of the plurality of inverters includes a first supply input coupled to the first current electrode of one of the plurality of switches, a second supply input coupled to the sec-end power supply terminal; and
   each of the plurality of inverters is responsive to a voltage potential at the first and second supply inputs to selectively apply a control signal to the control electrode of the one of the plurality of switches.

14. The circuit of claim 12, further comprising a controller coupled to a second power supply terminal, the power supply terminal, and the control line, the controller configured to selectively apply a control signal to the control line to control the plurality of inverters to bias the plurality of switches to provide the current flow path.

15. A circuit for electrostatic discharge (ESD) protection, the circuit comprising:
   a plurality of conductive terminals;
   a diode string formed from a first plurality of P-N junction devices, each of the first plurality of P-N junction devices having a first current electrode coupled to a control electrode of a previous P-N junction device in the diode string, and a second current electrode coupled to a first current electrode of a next bipolar junction transistor in the diode string; and
   a plurality of switches, each of the plurality of switches including a first current electrode coupled to the first current electrode of one of the first plurality of P-N junction devices, a second current electrode coupled to a second power supply terminal, and a control terminal; and
   wherein each of the plurality of switches is responsive to an ESD event to conduct an ESD current from the first current electrode of the one of the first plurality of P-N junction devices to the second power supply terminal.

16. The circuit of claim 15, wherein each of the plurality of switches is operable to dissipate at least a portion of the ESD current to the power supply terminal.

17. The circuit of claim 15, wherein the plurality of switches operates to dynamically terminate the diode string by dissipating the ESD current to a level that is below a threshold level for biasing a next one of the first plurality of P-N junction devices.

18. The circuit of claim 15, each of the plurality of switches comprises a metal oxide semiconductor field effect transistor.

19. The circuit of claim 15, wherein the ESD current dissipates over some but not all of the plurality of switches and adjacent ones of the first plurality of P-N junction devices relative to one of the plurality of conductive terminals that receives the ESD event.

20. The circuit of claim 15, further comprising:
   a control line; and
   a plurality of inverters, each inverter including an input coupled to the control line and including an output coupled to the control terminal of one of the plurality of switches.

* * * * *